(12) United States Patent
Hu et al.

(10) Patent No.: US 10,928,797 B2
(45) Date of Patent: Feb. 23, 2021

(54) ENERGY CONSUMPTION MANAGEMENT SYSTEM AND ENERGY CONSUMPTION MANAGEMENT METHOD

(71) Applicant: Industrial Technology Research Institute, Hsinchu (TW)

(72) Inventors: Chih-Jian Hu, Hsinchu (TW); Wen-Kuei Chang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 135 days.

(21) Appl. No.: 16/253,220

(22) Filed: Jan. 22, 2019

(65) Prior Publication Data

US 2020/0174437 A1 Jun. 4, 2020

(30) Foreign Application Priority Data

Nov. 29, 2018 (TW) .................................. 107142822

(51) Int. Cl.
*G05B 19/042* (2006.01)
*G01R 19/25* (2006.01)
(Continued)

(52) U.S. Cl.
CPC ..... *G05B 19/0428* (2013.01); *G01R 19/2506* (2013.01); *G06N 20/00* (2019.01); *G06Q 50/06* (2013.01); *G05B 2219/2639* (2013.01)

(58) Field of Classification Search
CPC ........ G05B 19/0428; G05B 2219/2639; G05B 15/02; G06N 20/00; G01R 19/2506;
(Continued)

(56) References Cited

U.S. PATENT DOCUMENTS 9,057,746 B1 * 6/2015 Houlette ................ G01R 21/00
2010/0274403 A1 * 10/2010 Maeda ...................... H02J 3/14
700/291
(Continued)

FOREIGN PATENT DOCUMENTS

| CN | 103149951 | 4/2015 |
| CN | 107247997 | 10/2017 |

(Continued)

OTHER PUBLICATIONS

Soham Chakraborty et al., "Application of Smart Meters in High Impedance Fault Detection on Distribution Systems," IEEE Transactions on Smart Grid, Apr. 19, 2018, pp. 1-9.

(Continued)

*Primary Examiner* — Chun Cao
(74) *Attorney, Agent, or Firm* — JCIPRNET

(57) ABSTRACT

An energy consumption management system and an energy consumption management method are provided. The method includes detecting an electricity status of an electronic device at a current time point to generate electricity detection data; calculating an energy consumption parameter set having a plurality of energy consumption parameters; determining a plurality of feature value corresponding to a plurality of feature rules according to the energy consumption parameters and the feature rules, wherein the feature values form a feature set corresponding to the current time point; determining a current energy consumption operation status of the electronic device according to the feature values and an activity model corresponding to the electronic device; and controlling the electronic device according to the current energy consumption operation status and a preset operation schedule of the electronic device. The method further includes learning the activity model according to electricity detection history data of the electronic device.

13 Claims, 10 Drawing Sheets

(51) Int. Cl.
*G06Q 50/06* (2012.01)
*G06N 20/00* (2019.01)
(58) Field of Classification Search
CPC . G06Q 50/06; G06Q 10/06; H02J 3/14; H02J 13/00004; H02J 4/00; G05F 1/66
USPC ......................................................... 700/291
See application file for complete search history.

(56) References Cited

U.S. PATENT DOCUMENTS

| | | | |
|---|---|---|---|
| 2011/0313693 A1* | 8/2011 | Inoue | G06Q 10/06 702/61 |
| 2012/0004871 A1 | 1/2012 | Tsao et al. | |
| 2012/0290230 A1 | 11/2012 | Berges Gonzalez et al. | |
| 2014/0172758 A1 | 6/2014 | Klinnert et al. | |
| 2015/0112496 A1* | 4/2015 | Fisher | H02J 4/00 700/291 |
| 2015/0268281 A1* | 9/2015 | Haghighat-Kashani | G01R 21/00 702/62 |
| 2018/0196094 A1* | 7/2018 | Fishburn | G01R 21/133 |
| 2019/0013669 A1* | 1/2019 | Davies et al. | G01D 4/004 |

FOREIGN PATENT DOCUMENTS

| | | |
|---|---|---|
| CN | 107730059 | 2/2018 |
| TW | 502153 | 9/2002 |
| TW | I379093 | 12/2012 |
| TW | 201822122 | 6/2018 |
| WO | 2018098562 | 6/2018 |

OTHER PUBLICATIONS

Ming-Chun Lin et al., "Design and implementation of a home and building gateway with integration of nonintrusive load monitoring meters,"2012 IEEE International Conference on Industrial Technology, Mar. 19-21, 2012, pp. 148-153.

Ahmed Zoha et al., "Non-intrusive load monitoring approaches for disaggregated energy sensing: A survey," Sensors 2012, vol. 12, No. 12, Dec. 2012, pp. 1-70.

Yi-Sheng Lai et al., "A novel search scheme for nonintrusive load monitoring systems," 2012 IEEE International Conference on Industrial Technology, Mar. 19-21, 2012, pp. 103-107.

I.T. Michailidis et al., "Energy-efficient HVAC management using cooperative, self-trained, control agents: A real-life German building case study," Applied Energy, vol. 211, Feb. 1, 2018, pp. 113-125.

Michael Baranski et al., "Non-Intrusive Appliance Load Monitoring based on an Optical Sensor," 2003 IEEE Bologna Power Tech Conference Proceedings, Jun. 23-26, 2003, pp. 1-8.

Jian Liang et al., "Load Signature Study—Part I: Basic Concept, Structure, and Methodology," IEEE Transactions on Power Delivery, vol. 25, No. 2, Apr. 2010, pp. 551-560.

Yung-Chi Chen et al., "Detecting users' behaviors based on nonintrusive load monitoring technologies," 2013 10th IEEE International Conference on Networking, Sensing and Control (ICNSC), Apr. 10-12, 2013, pp. 804-809.

D. Srinivasan et al., "Neural-Network-Based Signature Recognition for Harmonic Source Identification," IEEE Transactions on Power Delivery, vol. 21, No. 1, Jan. 2006, pp. 398-405.

Yi Du et al., "A review of identification and monitoring methods for electric loads in commercial and residential buildings," 2010 IEEE Energy Conversion Congress and Exposition, Sep. 12-16, 2010, pp. 4527-4533.

Suman Giri et al., "A study on the feasibility of automated data labeling and training using an EMF sensor in NILM platforms," 2012 International EG-ICE Workshop on Intelligent Computing, Jul. 2012, pp. 1-6.

Jiaming Li et al., "Power Decomposition Based on SVM Regression," 2012 Proceedings of International Conference on Modelling, Identification and Control, Jun. 24-26, 2012, pp. 1195-1199.

Shirantha Welikala et al., "Incorporating Appliance Usage Patterns for Non-Intrusive Load Monitoring and Load Forecasting," J IEEE Transactions on Smart Grid, vol. 10, No. 1, Jan. 2019, pp. 448-461.

Seyed Mostafa Tabatabaei et al., "Toward Non-Intrusive Load Monitoring via Multi-Label Classification," IEEE Transactions on Smart Grid, vol. 8, No. 1, Jan. 2017, pp. 26-40.

Yuping Zou et al., "Design of power management socket system for smart home appliances," 2008 Conference on Information Technology and Applications in Outlying Islands, May 4, 2018, pp. 246-250.

Pengwei Chen et al., "Network Model for Correlation Analysis of Short-term Electricity Consumption Behavior," Automation of Electric Power Systems, vol. 41, No. 3, Feb. 10, 2017, pp. 1-9.

Yongbiao Yang et al., "Intelligent Electricity Consumption Modeling and Optimal Simulations for Residential Users," Automation of Electric Power Systems, vol. 40, No. 3, Feb. 10, 2016, pp. 1-6.

Jun Lu et al., "Feature Selection Strategy for Electricity Consumption Behavior Analysis in Smart Grid," Automation of Electric Power Systems, vol. 41, No. 5, Mar. 10, 2017, pp. 1-7.

Longjun Wang et al., "Non-intrusive load monitoring algorithm based on features of V—Itrajectory," Electric Power Systems Research, vol. 157, Dec. 6, 2012, pp. 134-144.

Fernando Marcos Wittmann et al., "Nonintrusive Load Monitoring Algorithm Using Mixed-Integer Linear Programming," IEEE Transactions on Consumer Electronics, vol. 64, No. 2, May 2018, pp. 180-187.

"Notice of Allowance of Taiwan Counterpart Application," dated Oct. 18, 2019, p. 1-p. 4, in which the listed references were cited.

* cited by examiner

Eletricity detection history data at different time points

503

| Time point | Second eletricity detection data | History energy consumption operation status |
|---|---|---|
| T1 | 25.66 | Standby stage |
| T2 | 25.45 | Standby stage |
| T3 | 217.59 | Start brewing procedure |
| T4 | 567.32 | Enter grinding stage |
| T5 | 589.55 | Grinding stage |
| T6 | 374.78 | Enter heating stage |
| T7 | 364.98 | Heating stage |
| T8 | 753.24 | Enter pressuring stage |
| T9 | 734.24 | Pressuring stage |
| T10 | 125.16 | End brewing procedure |

FIG. 5B

Second feature sets and history energy consumption operation statuses at different time points, M=8

504

| Time point | f1 | f2 | f3 | f4 | f5 | f6 | f7 | f8 | History energy consumption operation status |
|---|---|---|---|---|---|---|---|---|---|
| T1 | T | T | T | T | T | F | T | T | Standby stage |
| T2 | T | T | T | T | F | F | T | T | Standby stage |
| T3 | T | F | T | F | T | F | T | T | Start brewing procedure |
| T4 | T | F | F | T | F | F | T | T | Enter grinding stage |
| T5 | F | F | T | F | F | T | F | F | Grinding stage |
| T6 | F | T | T | T | F | F | F | T | Enter heating stage |
| T7 | F | F | T | T | F | F | F | T | Heating stage |
| T8 | F | F | F | T | F | F | T | F | Enter pressuring stage |
| T9 | F | F | F | T | F | F | F | T | Pressuring stage |
| T10 | F | T | F | F | T | T | F | F | End brewing procedure |

T:TURE    f1~f8:Second feature values
F:FALSE

FIG. 5D

ENERGY CONSUMPTION MANAGEMENT SYSTEM AND ENERGY CONSUMPTION MANAGEMENT METHOD

CROSS-REFERENCE TO RELATED APPLICATION

This application claims the priority benefit of Taiwan application serial no. 107142822, filed on Nov. 29, 2018. The entirety of the above-mentioned patent application is hereby incorporated by reference herein and made a part of this specification.

TECHNICAL FIELD

The disclosure relates to a management system, and more particularly, relates to an energy consumption management system and an energy consumption management method for controlling electronic devices.

BACKGROUND

In general, the traditional approach for handling current operation statuses of multiple electronic devices is to make each electronic device itself actively transmit operation information reflecting the current operation status of the respective electronic device to a central control unit, so the central control unit can identify the current operation status of the electronic device according to the operation information.

However, normally, the electronic device itself does not actively transmit the operation information to the outside. Even if they do, the operation information transmitted by the different electronic devices may have different formats, which make it more difficult for the central control unit to manage.

Therefore, under the circumstance where the electronic device does not actively transmit operation information, how to determine the current operation status of the electronic device according to detected electricity data of the electronic device in order to realize a corresponding management mechanism is the goal to be achieved by persons skilled in the art.

SUMMARY

The disclosure provides an energy consumption management system and an energy consumption management method, which can manage operations of the monitored electronic device according to electricity data of the electronic device.

An embodiment of the disclosure provides an energy consumption management system. The system includes an electronic device and energy consumption management device. The energy consumption management device is coupled to the electronic device. The energy consumption management device is configured to detect a first electricity status of the electronic device at a current time point to generate first electricity detection data of the electronic device. The energy consumption management device is further configured to calculate a first energy consumption parameter set having a plurality of first energy consumption parameters according to the first electricity detection data. The energy consumption management device is further configured to determine a plurality of first feature values respectively corresponding to a plurality of feature rules according to the plurality of first energy consumption parameters and the plurality of feature rules. The plurality of first feature values correspond to the first electricity detection data, and the plurality of first feature values form a first feature set corresponding to the current time point. The energy consumption management device is further configured to determine a current energy consumption operation status of the electronic device according to the plurality of first feature values and an activity model corresponding to the electronic device. The energy consumption management device is further configured to control the electronic device according to the current energy consumption operation status of the electronic device and a preset operation schedule. The energy consumption management device further learns the activity model according to electricity detection history data of the electronic device.

An embodiment of the disclosure further provides an energy consumption management method, which includes: detecting a first electricity status of an electronic device at a current time point to generate first electricity detection data of the electronic device; calculating a first energy consumption parameter set having a plurality of first energy consumption parameters according to the first electricity detection data; determining a plurality of first feature values respectively corresponding to a plurality of feature rules according to the plurality of first energy consumption parameters and the plurality of feature rules, wherein the plurality of first feature values correspond to the first electricity detection data, and the plurality of first feature values form a first feature set corresponding to the current time point; determining a current energy consumption operation status of the electronic device according to the plurality of first feature values and an activity model corresponding to the electronic device; and controlling the electronic device according to the current energy consumption operation status and a preset operation schedule of the electronic device. The energy consumption management method further includes learning the activity model according to electricity detection history data of the electronic device.

Based on the above, under the circumstance where the electronic devices does not actively send its operation information (e.g., the energy consumption operation status), the energy consumption management system and the energy consumption management method provided by the disclosure can determine the energy consumption operation status in which the electronic device is currently operating by receiving the current electricity status of the electronic device, so as to execute subsequent management operations corresponding to the energy consumption operation status. In addition, the energy consumption management system and the energy consumption management method provided by the disclosure can learn the activity model corresponding to the electronic device according to the electricity detection history data of the electronic device, such that the energy consumption management system may estimate the current energy consumption operation status in which the electronic device is operating currently.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 5B is a schematic diagram illustrating electricity detection history data according to an embodiment of the disclosure.

FIG. 5D is a schematic diagram illustrating a plurality of second feature sets and corresponding history energy consumption operation statuses according to an embodiment of the disclosure.

DETAILED DESCRIPTION

Figure 1:
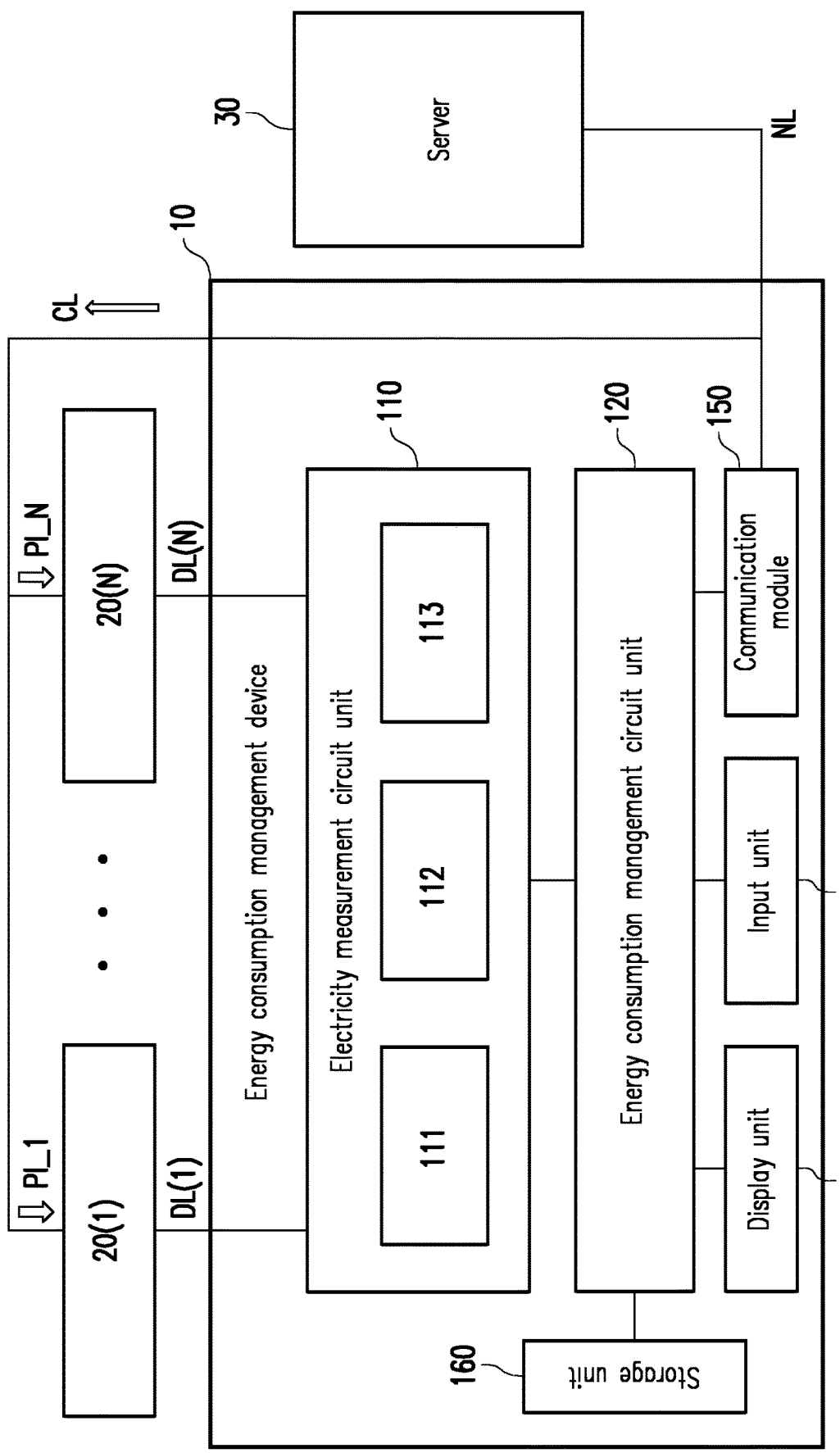
FIG. 1 is a block diagram illustrating an energy consumption management system according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a block diagram illustrating an energy consumption management system according to an embodiment of the disclosure.

With reference to FIG. 1, in this embodiment, an energy consumption management system 1 includes electronic devices 20(1) to 20(N) and an energy consumption management device 10. N is a positive integer. In another embodiment, the energy consumption management system 1 further includes a server 30. The energy consumption management device 10 includes an electricity measurement circuit unit 110, an energy consumption management circuit unit 120, a display unit 130, an input unit 140, a communication module 150 and a storage unit 160.

Each of the electronic devices 20(1) to 20(N) is connected to the electricity measurement circuit unit 110 in the energy consumption management device 10 respectively via wired connections DL(1) to DL(N) (e.g., power lines or other forms of wired connections). In addition, the energy consumption management circuit unit 120 is connected to the electronic devices 20(1) to 20(N) via a network connection CL established by the communication module 150. The network connection CL may be in form of wired or wireless. It should be noted that, in said another embodiment, the energy consumption management device 10 may be connected to the server 30 via a network connection NL established by the communication module 150.

The electronic devices 20(1) to 20(N) may be, for example, electronic devices that use electricity to operate, including general household electrical appliances, factory implements, office electronic devices, or commercial devices, and the like. The disclosure is not limited to the type of electronic device.

The electricity measurement circuit unit 110 is configured to detect electricity statuses of the electronic devices 20(1) to 20(N) to generate a plurality of electricity detection data respectively corresponding to the electronic devices 20(1) to 20(N). For instance, with respect to the electronic device 20(1), the electricity measurement circuit unit 110 can detect the electricity statuses of the electronic device 20(1) at a plurality of different time points over time to generate the plurality of electricity detection data of the electronic device 20(1) corresponding to the different time points. In an embodiment, the electricity measurement circuit unit 110 may include a voltage measurement circuit unit 111, a current measurement circuit unit 112 and a frequency measurement circuit unit 113. The type of the electricity detection data may include voltage data, current data and frequency data respectively detected by the voltage measurement circuit unit 111, the current measurement circuit unit 112 and the frequency measurement circuit unit 113. Further, the electricity measurement circuit unit 110 can calculate other types of electricity data, such as power values, according to the detected data described above. It should be noted that, for descriptive convenience, the electricity detection data used in this embodiment is the power value.

The display unit 130 is configured to display images and information, and the display unit 130 is, for example, a monitor. The input unit 140 is configured to input data through a user operation, and the input unit 140 is, for example, a keyboard, a mouse, or a touch pad. In addition, the display unit 130 may also be integrated with the input unit 140 as a touch screen, for example. The communication module 150 is configured to establish a network connection in wired or wireless manner, so the electronic devices 20(1) to 20(N) or the server 30 can transceive data or command with the energy consumption management device 10.

The storage unit 160 is configured to store data (e.g., electricity detection history data, an activity model, or other system data, software or firmware for managing the energy consumption management system), and the storage unit 160 is, for example, a solid state drive or a general traditional hard disk.

In said another embodiment, the server 30 is configured to receive information from the energy consumption management device 10 for subsequent corresponding application operations.

The energy consumption management circuit unit 120 is configured to determine current energy consumption operation statuses of the electronic devices 20(1) to 20(N) according to the plurality of electricity detection data, so as to execute a monitoring management corresponding to the electronic devices 20(1) to 20(N). Moreover, the energy consumption management circuit unit 120 (a processor 124)

is further configured to manage overall operation of the energy consumption management device 10. Details regarding the energy consumption management circuit unit 110 are described below with reference to FIG. 2.

Figure 2:
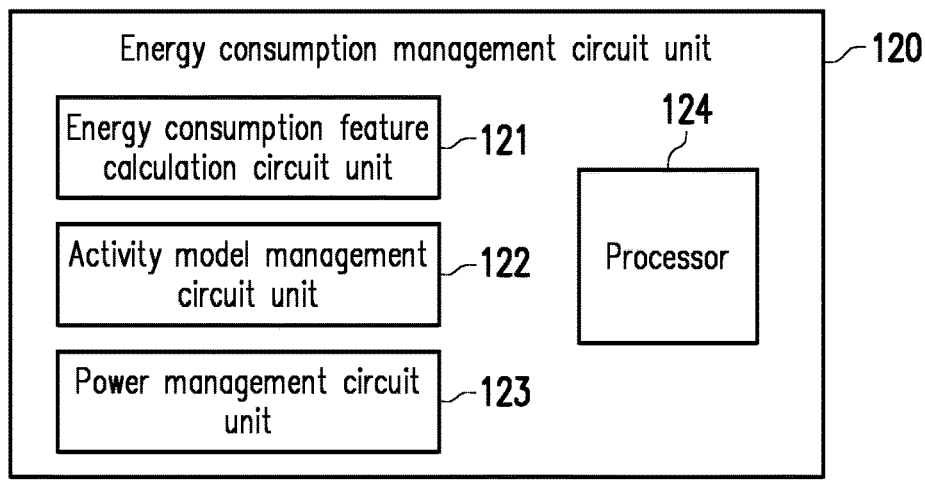
FIG. 2 is a block diagram illustrating an energy consumption management unit according to an embodiment of the disclosure.

FIG. 2 is a block diagram illustrating an energy consumption management unit according to an embodiment of the disclosure. With reference to FIG. 2, the energy consumption management circuit unit 120 includes an energy consumption feature calculation circuit unit 121, an activity model management circuit unit 122, a power management circuit unit 123 and the processor 124.

The processor 124 is hardware with computing capabilities (e.g., a chip set, a processor, etc.) for managing overall operation of the energy consumption management circuit unit 120. In this embodiment, the processor 124 is, for example, a central processing unit (CPU) of single-core or multi-core, a micro-processor, other programmable microprocessors, a digital signal processor (DSP), a programmable controller, an application specific integrated circuits (ASIC), a programmable logic device (PLD) or other similar devices.

Figure 5A:
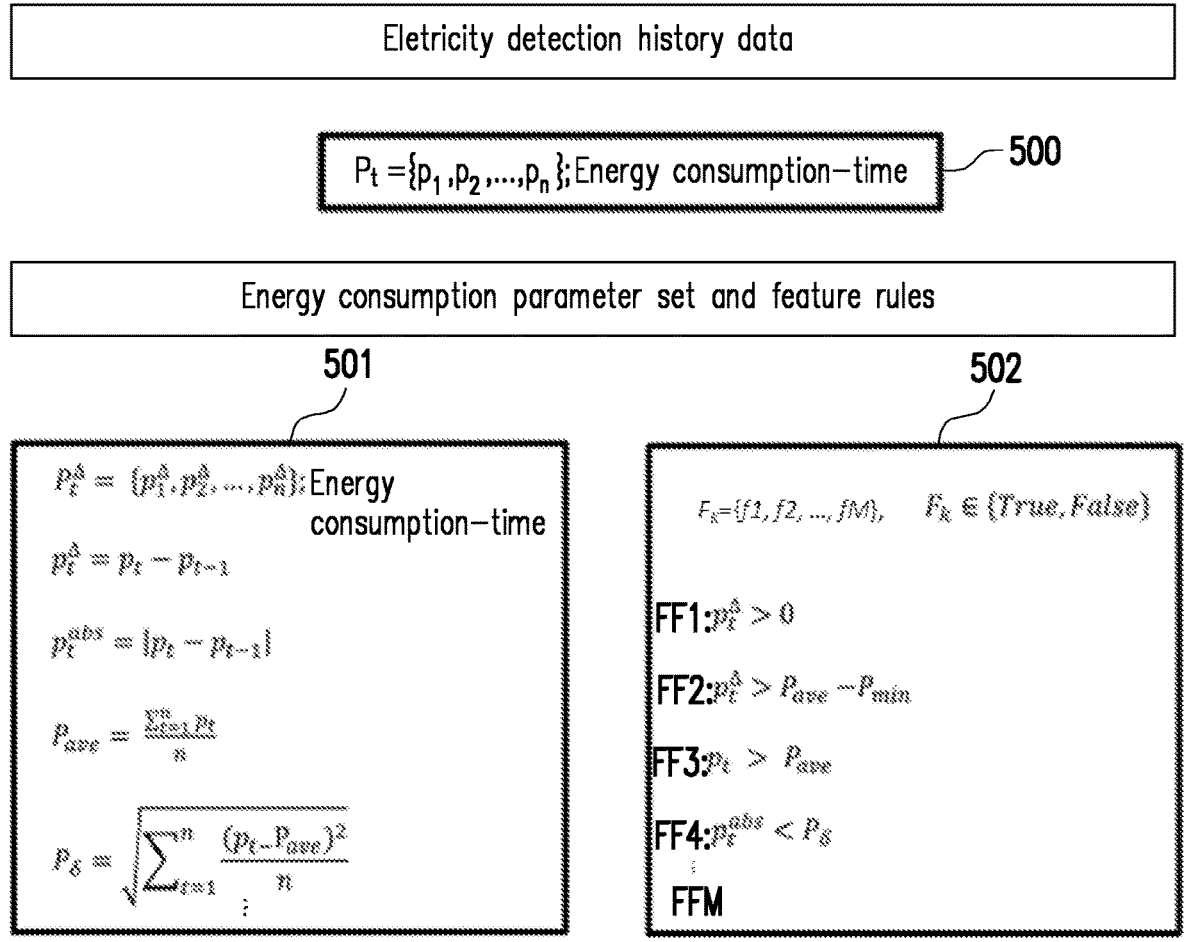
FIG. 5A is a schematic diagram illustrating an energy consumption parameter set and a feature rule according to an embodiment of the disclosure.

The energy consumption feature calculation circuit unit 121 is configured to calculate a plurality of energy consumption parameters (e.g., $P_t^\Delta$, $P_t^{abs}$, $P_{ave}$, $P_\delta$, etc. illustrated in FIG. 5A) corresponding to the electricity detection data and a feature set corresponding to the electricity detection data (e.g., $F_k$ illustrated in FIG. 5A) according to the electricity detection data (e.g., the power) corresponding to one electronic device.

The activity model management circuit unit 122 is configured to receive instructions of the processor 124 for executing an activity model creation operation corresponding to one electronic device (e.g., the electronic device 20(1) among the electronic devices), so as to create (learn) an activity model corresponding to said electronic device. The activity model management circuit unit 122 can record/update the created activity model. The activity model may be stored to the storage unit 160. In addition, the activity model management circuit unit 122 can determine the current energy consumption operation status of one electronic device (e.g., the electronic device 20(1) among the electronic devices) according to a first feature set of the electronic device corresponding to a current time point and the activity model corresponding to the electronic device.

The power management circuit unit 123 is configured to load a plurality of preset operation schedules respectively corresponding to the electronic devices 20(1) to 20(N) from the storage unit 160. The power management circuit unit 123 can receive the preset operation schedules from the server 30 via the communication module 150, or receive the preset operation schedules by an input operation applied to the input unit 140. The power management circuit unit 123 is further configured to determine whether a current electricity status or the current energy consumption operation status of each of the electronic devices 20(1) to 20(N) is normal according to the preset operation schedules. It should be noted that, in an embodiment, the power management circuit unit 123 itself can record the preset operation schedules corresponding to the electronic devices 20(1) to 20(N). In addition, in another embodiment, the server 30 can replace functions of the power management circuit unit 123. That is to say, the server 30 can determine whether the current electricity status or the current energy consumption operation status of each of the electronic devices 20(1) to 20(N) is normal according to the preset operation schedules, and can execute subsequent controls for the electronic devices 20(1) to 20(N) according to a determination result. The overall operation flows in the energy consumption management method and the corresponding energy consumption management device provided by the disclosure are described below with reference to FIG. 3 It should be noted that, operations of various components of the energy consumption management device 10 may be regarded as overall operation of the energy consumption management device 10; operations of various components of the electricity measurement circuit unit 110 may be regarded as overall operation of the electricity measurement circuit unit 110; operations of various components of the energy consumption management circuit unit 120 may be regarded as overall operation of the energy consumption management circuit unit 120.

Figure 3:
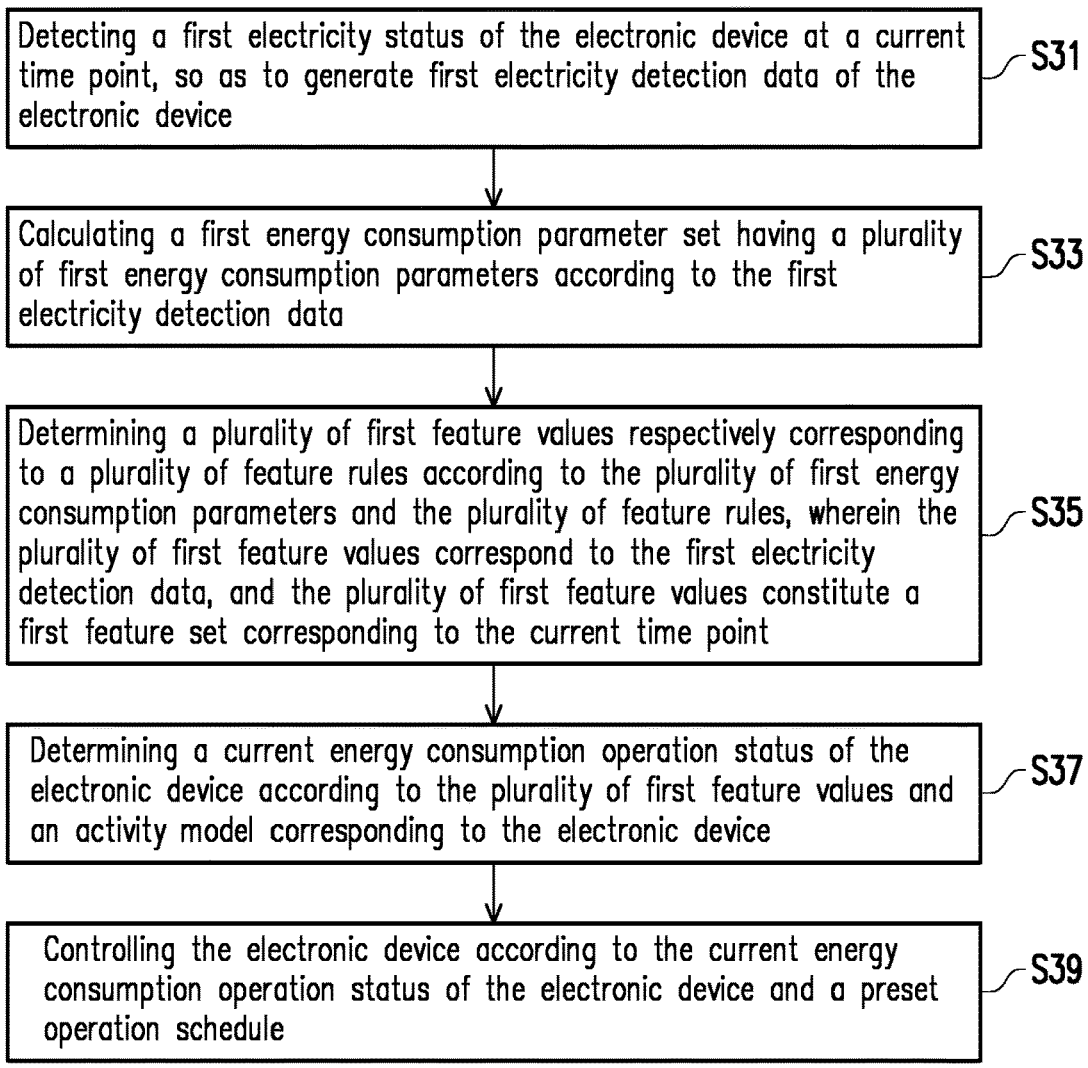
FIG. 3 is a flowchart illustrating an energy consumption management method according to an embodiment of the disclosure.

FIG. 3 is a flowchart illustrating an energy consumption management method according to an embodiment of the disclosure. With reference to FIG. 3, in step S31, the energy consumption management device 10 is used to detect a first electricity status of the electronic device at a current time point to generate first electricity detection data of the electronic device. For descriptive convenience, the following embodiments are exemplified by simply using the electron device 20(1). Nonetheless, the disclosure is not limited to the number of the electronic devices. In other words, the energy consumption management device 10 can detect the first electricity status of each of the electronic devices 20(1) to 20(N) at the current time point to generate the first electricity detection data of each of the electronic devices 20(1) to 20(N).

In detail, with the electronic device 20(1) as an example, the electricity measurement circuit unit 110 is used to detect the electricity status of the electronic device 20(1) (a.k.a. the first electricity status) via the wired connection DL(1) to generate the electricity detection data corresponding to the electronic device 20(1) (a.k.a. the first electricity detection data). The first electricity status of the electronic device 20(1) is, for example, a current status, a voltage status, or a frequency (e.g., AC frequency) of the electronic device 20(1) or time corresponding to aforesaid statuses. In addition, the electricity measurement circuit unit 110 can calculate the power of the electronic device 20(1) (i.e., generate the first electricity detection data) according to a current value, a voltage value or a time of the measured electronic device 20(1). The first electricity detection data may include, for example, the power values respectively corresponding to different time points. The generated first electricity detection data is then transmitted to the energy consumption management circuit unit 120.

Next, in step S33, the energy consumption management device 10 is used to calculate a first energy consumption parameter set having a plurality of first energy consumption parameters according to the first electricity detection data.

FIG. 5A is a schematic diagram illustrating an energy consumption parameter set and a feature rule according to an embodiment of the disclosure. With reference to FIG. 5A, specifically, it is assumed that the received electricity detection data is the power value of the electronic device 20(1). The energy consumption feature calculation circuit unit 121 can use the power value to obtain a plurality of energy consumption parameters (e.g. $P_t^\Delta$, $P_t^{abs}$, $P_{ave}$, $P_\delta$, etc. illustrated in FIG. 5A) by expanding a data dimension of the power value through a plurality of formulas (see the formulas in a region 501 in FIG. 5A). For example, the energy consumption feature calculation circuit unit 121 calculates $P_t^{abs}$ according to a power value $P_t$ at the current time point together with the power value of the electronic device 20(1) at a previous time point, where $P_t^{abs}$ is one of the energy consumption parameters. In other words, $P_t^{abs}$ is one data dimension expanded from the power value. The energy consumption feature calculation circuit unit 121 will consider the calculated energy consumption parameters in different types as a current energy consumption parameter set corresponding to the electronic device 20(1). It should be noted that, the disclosure is not limited to the formulas for expanding the data dimension. The formulas for expanding the power value of the electronic device 20(1) may be preset according to physical characteristics, specifications, or characteristics of the process of energy consumption operation of the electronic device 20(1).

Referring back to FIG. 3, next, in step S35, the energy consumption management device 10 is used to determine a plurality of first feature values respectively corresponding to a plurality of feature rules according to the plurality of first energy consumption parameters and the plurality of feature rules, wherein the plurality of first feature values correspond to the first electricity detection data, and the plurality of first feature values form a first feature set corresponding to the current time point.

For instance, in view of the feature rules (e.g., M feature rules $FF_1$ to $FF_M$) in a region 502 illustrated in FIG. 5A, a first feature rule (i.e., $FF_1$: $P_t^\Delta > 0$) determines whether an energy consumption parameter $P_t^\Delta$ is greater than 0. Based on a determination result, the feature value $f_1$ corresponding to the feature rule $FF_1$ may be obtained. More specifically, the feature value is a Boolean value, and the Boolean value includes a truth value (which may be expressed by True, T or 1) or a false value (which may be expressed as False, F or 0). In other words, with use of the feature rules and the energy consumption parameters of the current energy consumption parameter set corresponding to the electronic device 20(1), the energy consumption feature calculation circuit unit 121 can determine the feature values $f_1$ to $f_M$ respectively corresponding to the feature rules $FF_1$ to $FF_M$. The Boolean values/the feature values respectively corresponding to the feature rules may be regarded as the whole feature set (e.g., $F_k$) corresponding to the electricity detection data of the electronic device 20(1) at the current time point. For example, the first feature values corresponding to the first electricity detection data at the current time point can form a first feature set corresponding to the current time point.

Referring back to FIG. 3, next, in step S37, the energy consumption management device 10 is used to determine a current energy consumption operation status of the electronic device according to the plurality of first feature values and an activity model corresponding to the electronic device. Specifically, after the first feature set and the first feature values therein are obtained, the activity model management circuit unit 122 can find one of estimated energy consumption operation statuses corresponding to the first feature values through the activity model corresponding to the electronic device according to an order of the first feature values in the first feature set (e.g., starting from the feature value $f_1$).

Figure 6:
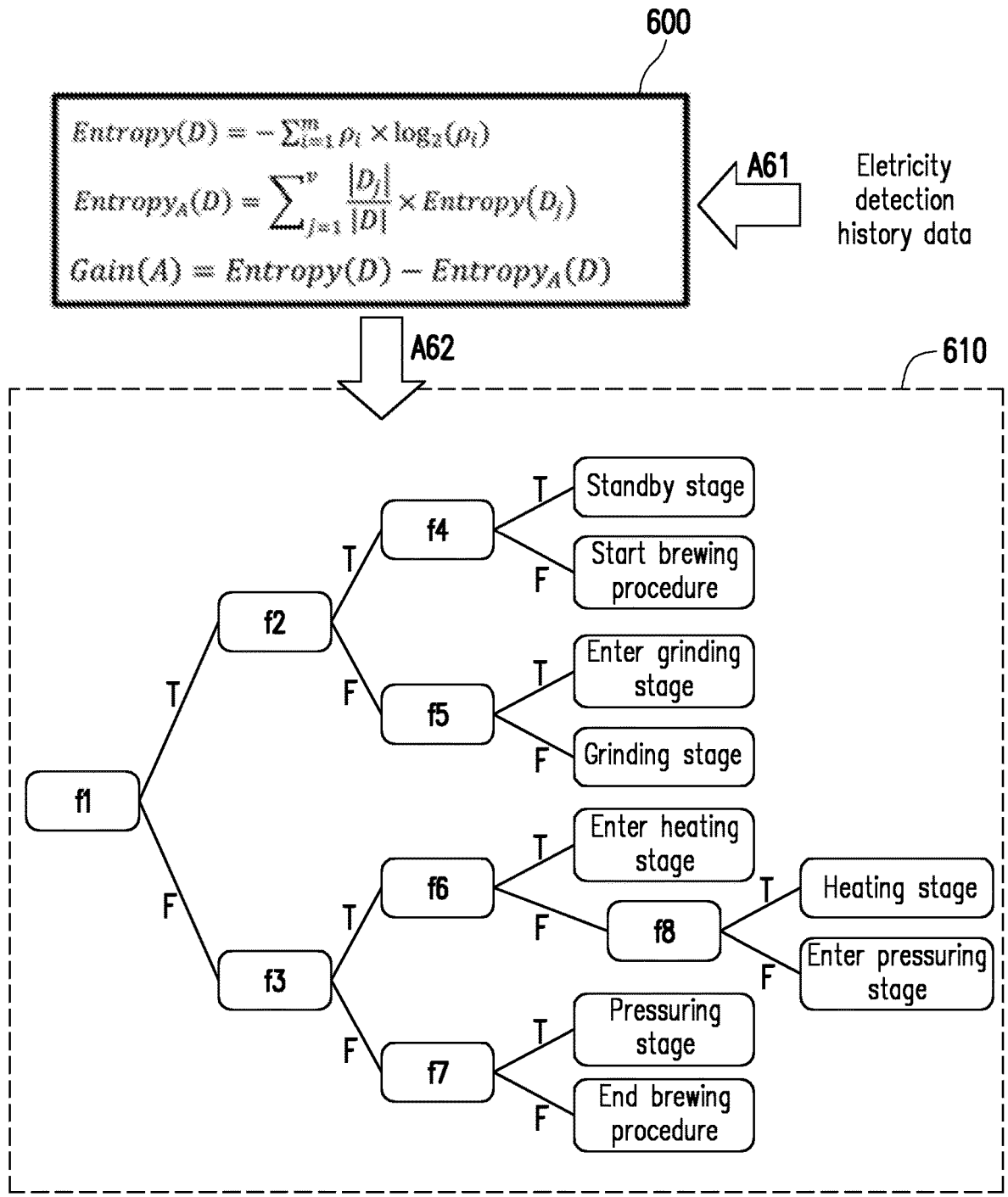
FIG. 6 is a schematic diagram illustrating the activity model created based on the electricity detection history data according to an embodiment of the disclosure.

FIG. 6 is a schematic diagram illustrating the activity model created based on the electricity detection history data according to an embodiment of the disclosure. For instance, as illustrated in FIG. 6, an activity model 610 corresponding to the electronic device 20(1) is of decision tree architecture. The activity model 610 has a plurality of layers, and a top layer (a start layer) only includes one start node, which is configured to indicate a $1^{st}$ feature value $f_1$ of the first feature set. Next, according to the Boolean value (T or F) of the feature value $f_1$, the start node may be connected to two nodes of a second layer; each node of the second layer is, according to the Boolean value of the feature value corresponding to each node, connected to two nodes of a third layer. The above process repeats until all of the first feature values and the estimated energy consumption operation status correspond to all nodes of the activity model 610. It should be noted that, a plurality of end nodes of the activity model 610 are configured to indicate the estimated energy consumption operation statuses (e.g., "Standby stage", "Start brewing procedure", "Enter grinding stage", "Grinding stage", "Enter heating stage", "Heating stage", "Enter pressuring stage", "Pressuring stage" and "End brewing procedure").

In other words, according to the first feature values of the first feature set, starting from the feature value $f_1$, the activity model management circuit unit 122 can determine the next node to be connected to according to the feature value of the currently connected node until one of the end nodes is being connected, and obtain the estimated energy consumption operation status connected at last.

For instance, it is assumed that, M is 8, the current time point is a time point T1, and the first feature set $F_k$ corresponding to the time point T1 is $\{T, T, T, T, T, F, T, T\}$ (which may also be expressed as $\{1, 1, 1, 1, 1, 0, 1, 1\}$), i.e., $f_1$=T; $f_2$=T; $f_3$=T; $f_4$=T; $f_5$=T; $f_6$=F; $f_7$=T; $f_8$=T. The activity model management circuit unit 122 inputs the first feature set $F_k$ to the activity model 610 and starts the determination from the feature value $f_1$. For example, according to the feature value $f_1$ being "T", the activity model management circuit unit 122 proceeds to the node corresponding to the feature value $f_2$; according to the feature value $f_2$ being "T", the activity model management circuit unit 122 proceeds to the node corresponding to the feature value $f_4$; according to the feature value $f_4$ being "T", the activity model management circuit unit 122 proceeds to the estimated energy consumption operation status corresponding to "Standby stage" (one of the end nodes). In other words, according to the first feature set $F_k$ being $\{T, T, T, T, T, F, T, T\}$ and the activity model 610, the estimated energy consumption operation status determined by the activity model management circuit unit 122 is "standby stage", and thus the energy consumption operation status of the electronic device 20(1) corresponding to the current time point T1 is "standby stage". A method for creating the activity model 610 is described below with reference to FIG. 4.

Figure 4:
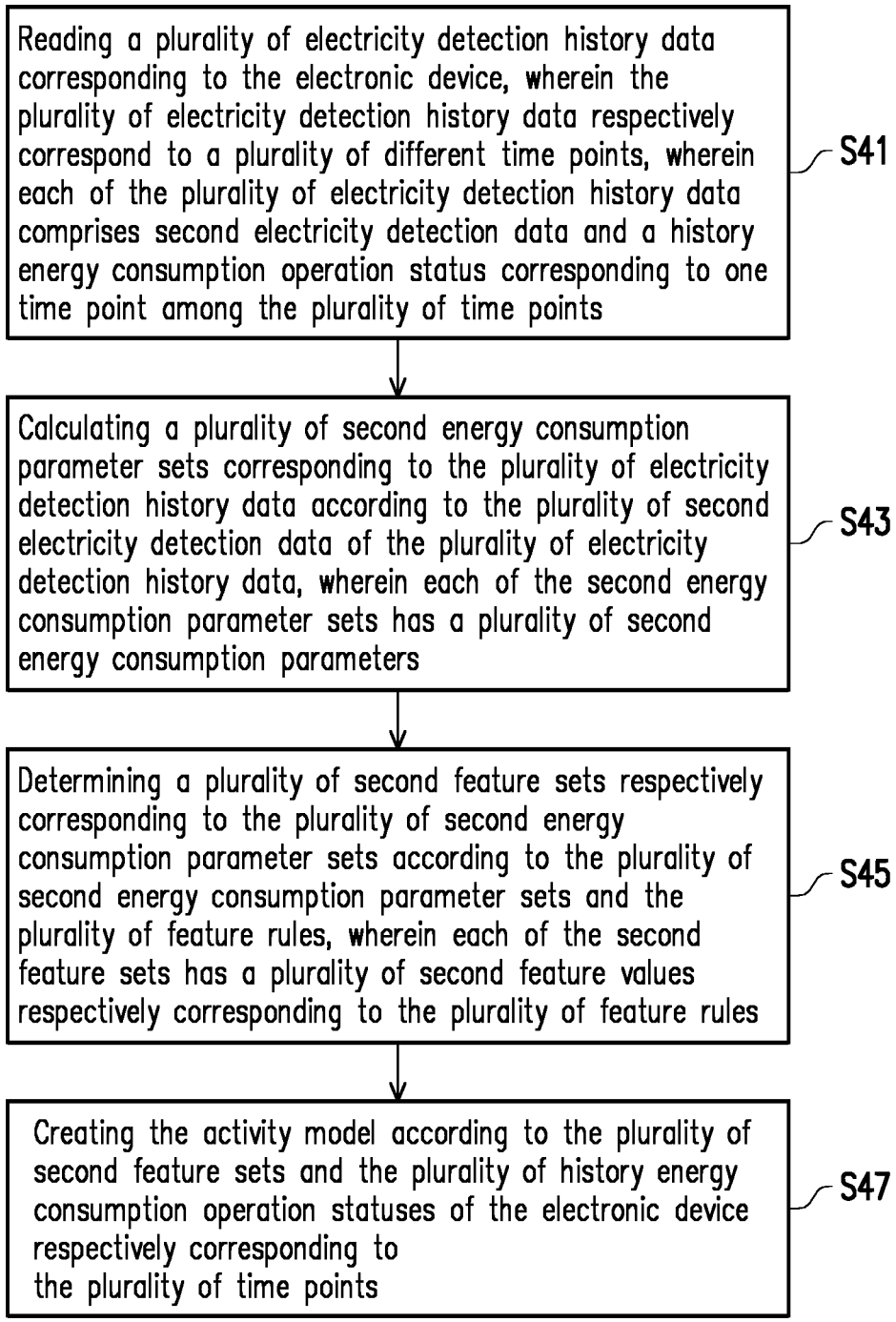
FIG. 4 is a flowchart illustrating a method for creating an activity model according to an embodiment of the disclosure.

FIG. 4 is a flowchart illustrating a method for creating an activity model according to an embodiment of the disclosure. With reference to FIG. 4, in this embodiment, as described above, the energy consumption management device 10 is further used to generate the activity model corresponding to one electronic device by executing a rule creation operation. The rule creation operation may include steps S41, S43, S45 and S47.

In detail, in step S41, the activity model management circuit unit 122 reads a plurality of electricity detection history data corresponding to the electronic device, wherein the plurality of electricity detection history data respectively correspond to a plurality of different time points, wherein each of the plurality of electricity detection history data comprises second electricity detection data and a history energy consumption operation status corresponding to one time point among the plurality of time points.

FIG. 5B is a schematic diagram illustrating electricity detection history data according to an embodiment of the disclosure. With reference to FIG. 5B, in this embodiment, it is assumed that the plurality of electricity detection history data of the electronic device 20(1) are as shown by a table

503. Each entry of the electricity detection history data may record the following information: (1) the time point; (2) the second electricity detection history data corresponding to the time point; (3) the history energy consumption operation status.

For example, a first entry of the electricity detection history data records the time point "T1", the second electricity detection history data "25.66", and the history energy consumption operation status "Standby stage". It should be noted that, as described above, in this embodiment, the electricity detection data is the power, and its unit is watt. In other words, the electricity detection history data above is used to indicate that, the power of the electronic device 20(1) is "25.66" at the time point "T1" and the electronic device 20(1) operates in "Standby stage". A method for generating the plurality of the electricity detection history data is described below with reference to FIG. 5C.

Figure 5C:
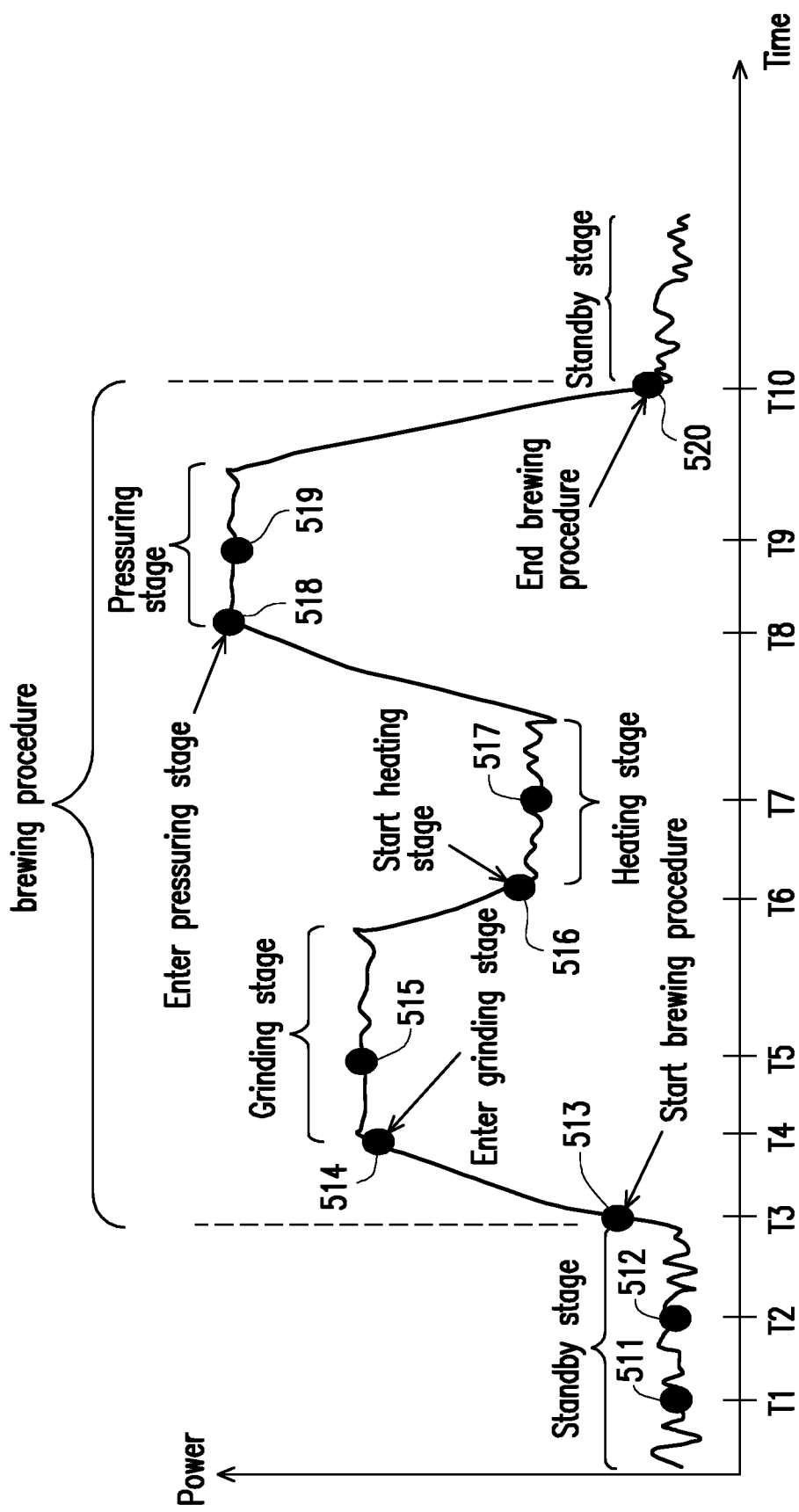
FIG. 5C is a schematic diagram illustrating energy consumption operation statuses of the electronic device at different time points according to an embodiment of the disclosure.

FIG. 5C is a schematic diagram illustrating energy consumption operation statuses of the electronic device at different time points according to an embodiment of the disclosure. With reference to FIG. 5C, for instance, it is assumed that the electronic device 20(1) is a coffee machine. Further, as shown by a power curve in FIG. 5C, the electronic device 20(1) will be in different operation stages over time, and the power detected at each time point of each stage will also changes correspondingly. For instance, after being powered on, the electronic device 20(1) first enters "Standby stage", and the power steadily stays at a low level. Next, the operating status changes to "Start brewing procedure" (e.g., a start button for brewing procedure of the electronic device 20(1) is being pressed), and the power starts to rise. Next, the operation status changes to a first transition stage, and the power significantly rises (where the power curve shows a rising oblique line) until the power rises to the power corresponding to the operation status "Enter grinding stage". Next, the operation status changes to "Grinding stage", and the power steadily changes within a range (where the power curve approximates a horizontal vibration curve) in the operation status "Grinding stage".

After "Grinding stage" is ended, the operation status changes to a second transition stage. At the time, the power starts to drop (where the power curve shows a falling oblique line) until the power drops to the operation status "Start heating stage". Next, the operation status changes to "Heating stage", and the power steadily changes within a range (where the power curve approximates a horizontal vibration curve) in the operation status "Heating stage".

After "Heating stage" is ended, the operation status changes to a third transition stage. At the time, the power starts to rise (where the power curve shows a rising oblique line) until the power rises to the operation status "Enter pressuring stage". Next, the operation status changes to "Pressuring stage", and the power steadily changes within a range (where the power curve approximates a horizontal vibration curve) in the operation status "Pressuring stage".

After "Pressuring stage" is ended, the operation status changes to a fourth transition stage. At the time, the power starts to drop (where the power curve shows a falling oblique line) until the power drops to the operation status "End brewing procedure". Next, the operation status changes to "Standby stage".

The electricity measurement circuit unit 110 can select a plurality of time points (e.g., the time points T1 to T10), and detect the electricity detection data (e.g., powers 511 to 520) of the electronic device 20(1) at the plurality of selected time points. Next, the energy consumption management circuit unit 120 (or the activity model management circuit unit 122) can generate the plurality of electricity detection history data according to the plurality of electricity detection data at the time points and the plurality of history energy consumption operation statuses corresponding to the plurality of time points T1 to T10, and record the plurality of electricity detection history data (e.g., by storing the plurality of the electricity detection history data to the storage unit 160 or the energy consumption management circuit unit 120). In this embodiment, in correspondence to the plurality of selected time points, the user can input the plurality of history energy consumption operation statuses corresponding to the plurality of time points T1 to T10 to the electronic device 20(1) by the input unit 140.

Referring back to FIG. 4, next, in step S43, the energy consumption management device 10 calculates a plurality of second energy consumption parameter sets corresponding to the plurality of electricity detection history data according to the plurality of second electricity detection data of the plurality of electricity detection history data, wherein each of the second energy consumption parameter sets has a plurality of second energy consumption parameters. For example, the plurality of the electricity detection history data corresponding to the electronic device 20(1) may be a set of the power value $P_t$ $\{P_1, P_2, \ldots, P_n\}$ shown by a region 500, wherein $P_1, P_1, \ldots, P_n$ respectively correspond to the different time points (e.g., the plurality of second electricity detection data/the power values corresponding to the different time points as recorded by the table 503).

For instance, according to the table 503 of FIG. 5B, the set of the power value $P_t$ of the plurality of multiple electricity detection history data of the electronic device 20(1) corresponding to the time points T1 to T10 (n=10) is {25.66, 25.45, 217.59, 567.32, 589.55, 374.78, 364.98, 753.24, 734.24, 125.16}. The energy consumption feature calculation circuit unit 121 can calculate the corresponding second energy consumption parameters (e.g., $P_t^A$, $P_t^{abs}$, $P_{ave}$, $P_\delta$, etc. illustrated in FIG. 5A) according to the set of the power value $P_t$, but the disclosure is not limited thereto. A plurality of formulas for calculating the second energy consumption parameters of the electronic device 20(1) at one time point may be identical to or different from the formulas listed in the region 501. The second energy consumption parameters corresponding to one time point can form the second energy consumption parameter set corresponding to said one time point. In other words, the energy consumption feature calculation circuit unit 121 can obtain different second energy consumption parameter sets corresponding to the different time points through step S43.

Next, in step S45, the energy consumption management device 10 determines a plurality of second feature sets respectively corresponding to the plurality of second energy consumption parameter sets according to the plurality of second energy consumption parameter sets and the plurality of feature rules, wherein each of the second feature sets has a plurality of second feature values respectively corresponding to the plurality of feature rules. Specifically, the energy consumption feature calculation circuit unit 121 can obtain a plurality of second feature values $f_1$ to $f_8$ corresponding to a plurality of feature rules $FF_1$ to $FF_8$ according to the second energy consumption parameter set of each time point and the feature rules $FF_1$ to $FF_8$ corresponding to the electronic device 20(1).

FIG. 5D is a schematic diagram illustrating a plurality of second feature sets and corresponding history energy consumption operation statuses according to an embodiment of the disclosure. With reference to FIG. 5D, for instance, the obtained second feature sets (and the second feature values $f_1$ to $f_8$ therein) corresponding to the time points T1 to T10 and the corresponding history energy consumption operation statuses are as shown by a table 504.

Lastly, in step S47, the energy consumption management device 10 creates the activity model according to the plurality of second feature sets and the plurality of history energy consumption operation statuses of the electronic device respectively corresponding to the plurality of time points.

With reference to FIG. 6, specifically, the plurality of second electricity detection data corresponding to the different time points recorded by the table 503 are input to a learning model (as shown by an arrow A61). The learning model is, for example, an algorithm containing a plurality of formulas in a region 600 of FIG. 6. The learning model can derive the plurality of feature rules $FF_1$ to $FF_M$ according to the inputted plurality of second electricity detection data corresponding to the different time points. Also, the learning model can generate the second feature sets and the history energy consumption operation statuses corresponding to the different time points as recorded by the table 504 through the plurality of second electricity detection data corresponding to the different time points, and generate the corresponding activity model 610 (e.g., a decision tree 610).

In other words, the activity model management circuit unit 122 can generate (learn) the corresponding activity model 610 through the formulas of the learning model, the plurality of second electricity detection data, the second feature sets and the history energy consumption operation statuses corresponding to the different time points (as shown by an arrow A62). It should be noted that, the disclosure is not limited to the specific detail of the learning model.

After the activity model 610 is created, the activity model management circuit unit 122 will record the created activity model. Later, the energy consumption operation status of the electronic device at one time point may be determined by using the created activity model according to the electricity detection data of the electronic device at that time point.

For instance, with reference to FIG. 6, it is assumed that the created activity model corresponding to the electronic device 20(1) is the decision tree 610 shown by FIG. 6. The processor 124 or the activity model management circuit unit 122 reads the decision tree corresponding to the electronic device 20(1), and obtains a final determination result (i.e., the estimated energy consumption operation status obtained at last) by comparing the first feature set corresponding to the electronic device 20(1) at the current time point with the decision tree 610. That is to say, the energy consumption management circuit unit 120 determines that the energy consumption operation status of the electronic device 20(1) is one of the estimated energy consumption operation statuses according to the decision tree 610 and the first feature set corresponding to the current time point.

For instance, as illustrated in FIG. 6, the decision tree 610 has a plurality of layers, and a top layer (start layer) only has one start node, which corresponds to a the first one (referred to as $1^{st}$, hereinafter) second feature value $f_1$ of each of the second feature sets. Next, according to the Boolean value (True or False, T or F) of the $1^{st}$ second feature value $f_1$ corresponding to the start node, the start node can be connected to two nodes of a second layer (sub-nodes of the start node), and the two nodes respectively correspond to a $2^{nd}$ (the second one) second feature value $f_2$ (in response to the Boolean value of the second feature value $f_1$ is T, the corresponding start node would be connected to the node corresponding to the $2^{nd}$ second feature value $f_1$) and a $3^{rd}$ second feature value $f_3$ (in response to the Boolean value of the second feature value $f_1$ is T, the corresponding start node would be connected to the node corresponding to the $2^{nd}$ second feature value $f_2$) of each of the second feature sets; Each node of the second layer is, according to the Boolean value of the feature value corresponding to each node, connected to two nodes among multiple nodes of a third layer (the multiple nodes of the third layer respectively correspond to the second feature values $f_4$~$f_7$ of the second feature set). The above process repeats until all of the second feature values and the estimated energy consumption operation status correspond to all nodes of the decision tree 610. It should be noted that, a plurality of end nodes of the generated decision tree 610 are configured to indicate the estimated energy consumption operation statuses (e.g., "Standby stage", "Start brewing procedure", "Enter grinding stage", "Grinding stage", "Enter heating stage", "Heating stage", "Enter pressuring stage", "Pressuring stage" and "End brewing procedure"). The end nodes do not have any sub-node. Among all nodes of the multiple layers, a plurality of nodes other than the end nodes and the start node may be referred to as relay nodes.

Referring back to FIG. 3, next, in step S39, the energy consumption management device 10 controls the electronic device according to the current energy consumption operation status of the electronic device and a preset operation schedule.

For instance, the power management circuit unit 123 or the processor 124 can identify a standard energy consumption operation status of the electronic device 20(1) corresponding to the current time point according to the preset operation schedule and the current time point. For example, the manufacturer may pre-design the preset operation schedule, wherein the preset operation schedule may include the power curve and preset energy consumption operation statuses corresponding to different time periods shown in FIG. 5C.

The power management circuit unit 123 or the processor 124 can find (identify) the standard energy consumption operation status corresponding to the current time point in the preset energy consumption operation statuses of the preset operation schedule according to the preset operation schedule and the current time point. If the found standard energy consumption operation status is not identical to the current energy consumption operation status, the energy consumption management device sends a control command corresponding to the standard energy consumption operation status to the electronic device according to the standard energy consumption operation status so that the electronic device operates in the standard energy consumption operation status.

Figure 7:
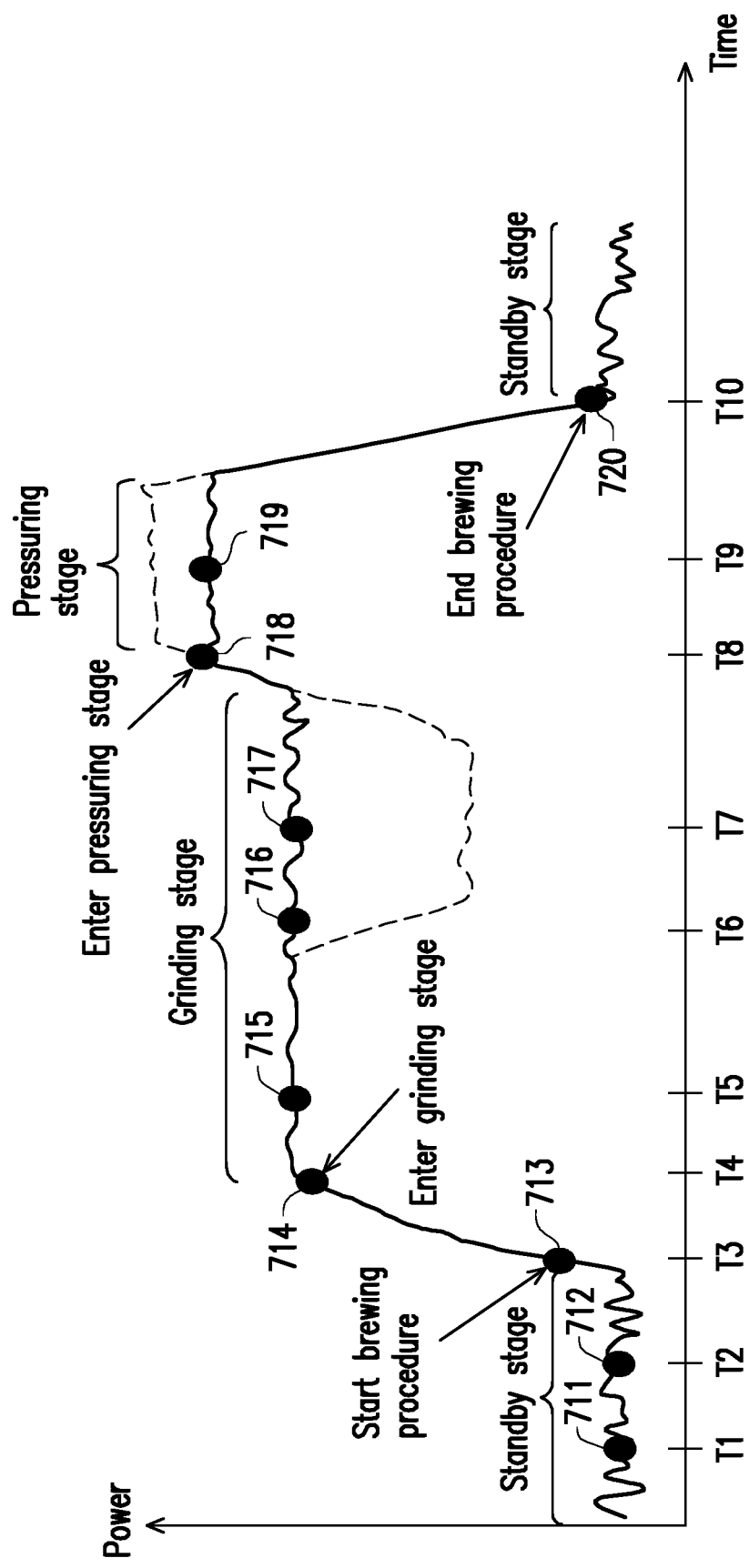
FIG. 7 is a schematic diagram illustrating estimated energy consumption operation statuses of the electronic device at different time points according to an embodiment of the disclosure.

FIG. 7 is a schematic diagram illustrating estimated energy consumption operation statuses of the electronic device at different time points according to an embodiment of the disclosure. With reference to FIG. 7, for instance, it is assumed that the different powers of the electronic device 20 at different times has a power curve as illustrated in FIG. 7 (where a dotted line indicates the power curve of the preset operation schedule in a specific time period). In addition, it is assumed that the current time point is the time point T6, and the electronic device 20(1) operates with a power 716 at the time point T6. At the time, the energy consumption management device 10 determines that the electronic device 20(1) operates in "Grinding stage" (i.e., the current energy consumption operation status is "Grinding stage").

However, as shown in FIG. 5C, because the standard energy consumption operation status corresponding to the time point T6 is "Start heating stage", the power management circuit unit 123 or the processor 124 then determines that the found standard energy consumption operation status "Start heating stage" is not identical to the current energy consumption operation status "Grinding stage". Accordingly, the power management circuit unit 123 or the processor 124 can generate a control command PI_1 for controlling the electronic device 20(1) to operate in "Start heating stage", and transmit the control command P_1 to the electronic device 20(1) via the network connection CL. In this way, after receiving the control command PI_1, the electronic device 20(1) is adjusted to operate in the energy consumption operation status "Start heating stage" (which is identical to the standard energy consumption operation status corresponding to the time point T6).

Similarly, it assumed that the current time point is the time point T7, and the electronic device 20(1) operates with a power 717 at the time point T7. At the time, the energy consumption management device 10 determines that the electronic device 20(1) operates in "Grinding stage" (the current energy consumption operation status is determined as "Grinding stage"). However, as shown in FIG. 5C, because the standard energy consumption operation status corresponding to the time point T7 is found as "Heating stage", the power management circuit unit 123 or the processor 124 then determines that the found standard energy consumption operation status "Heating stage" current energy consumption operation status "Grinding stage" is not identical to the. Accordingly, the power management circuit unit 123 or the processor 124 can generate another control command P_1 for controlling the electronic device 20(1) to operate in "Heating stage", and transmit said another control command P_1 to the electronic device 20(1) via the network connection CL. In this way, after receiving said another control command PI_1, the electronic device 20(1) is adjusted to operate in the energy consumption operation status "Heating stage" (which is identical to the standard energy consumption operation status corresponding to the time point T7).

On the other hand, in this embodiment, the preset operation schedule further records a plurality of preset electricity data corresponding to the plurality of preset energy consumption operation statuses. In this way, the power management circuit unit 123 or the processor 124 can further detect whether the electricity detection data corresponding to the current energy consumption operation status is normal. Specifically, the energy consumption management device 10 can identify standard electricity data corresponding to the standard energy consumption operation status from the plurality of preset electricity data. If the current energy consumption operation status is identical to the standard energy consumption operation status, the energy consumption management device 10 determines whether the current energy consumption operation status is abnormal by comparing the standard electricity data with the first electricity detection data.

With reference to FIG. 7, for instance, it is assumed that the current time point is the time point T9, a value of the first electricity detection data (a power 719) corresponding to the electronic device 20(1) is 650 (watt), and the electricity detection data 120 determines that the energy consumption status of the electronic device 20(1) corresponding to the current time point is "Pressuring stage" (the current energy consumption operation status is determined as "Pressuring stage"). In addition, the standard energy consumption operation status corresponding to the time point T9 is determined as "Pressuring stage", and the corresponding standard electricity data is 734.24 (watt).

In this example, although the current energy consumption operation status "Pressuring stage" is identical to the found standard energy consumption operation status "Pressuring stage" corresponding to the time point T9, the power management circuit unit 123 or the processor 124 determines that the value of the first electricity detection data (the power 719) is not identical to the corresponding standard electricity data (i.e., 650 watt 734.24 watt). In this case, the power management circuit unit 123 or the processor 124 can generate an abnormality notification. The abnormality notification is configured to notify the user or other related electronic device/personnel that "Pressuring stage" of the electronic device 20(1) at the current time point T9 is abnormal.

It is worth noting that, in an embodiment, the power management circuit unit 123 or the server 124 may generate yet another control command PI_1 corresponding to the abnormality notification, and transmit said yet another control command PI_1 to the electronic device 20(1) via the network connection CL, so that the power of the electronic device 20(1) operating in "Pressuring stage" can become 734.24 watt.

It is worth noting that, in foregoing embodiments, the energy consumption management device 10 may be regarded as a smart power meter, which is capable of learning a correlation between the electricity status and the operation status of the electronic device and sending control commands PI_1 to PIN for controlling the electronic devices 20(1) to 20(N) according to the determined current energy consumption operation statuses of the electronic devices and the preset operation schedules. Nevertheless, the disclosure is not limited in this regard. For example, in another embodiment, the energy consumption management system is applicable to general traditional common power meters. Details regarding the same will be described below with reference to FIG. 8.

Figure 8:
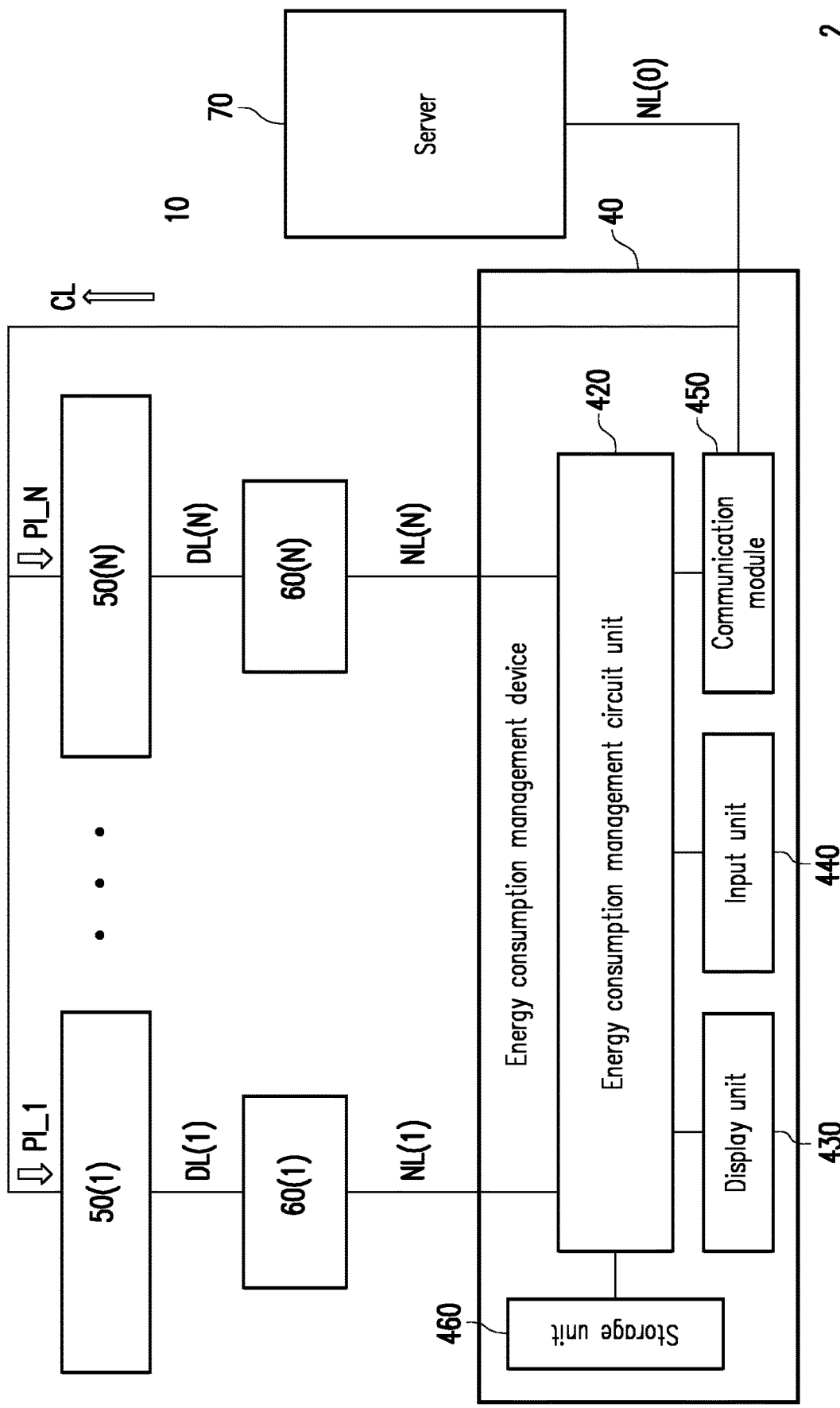
FIG. 8 is a block diagram illustrating an energy consumption management system according to another embodiment of the disclosure.

FIG. 8 is a block diagram illustrating an energy consumption management system according to another embodiment of the disclosure. With reference to FIG. 8, in this embodiment, an energy consumption management system 2 includes a plurality of electronic devices 50(1) to 50(N), a plurality of power meters 60(1) to 60(N) and an energy consumption management device 40. In another embodiment, the energy consumption management system 2 further includes a server 70. The difference between the energy consumption management device 40 and the energy consumption management device 10 is that, the energy consumption management device 40 does not include the electricity measurement circuit unit 110. However, the energy consumption management device 40 can receive electricity detection data from the power meters 60(1) to 60(N) via network connections NL(1) to NL(N) to the power meters 60(1) to 60(N). It should be noted that, functions of other devices in the energy consumption management device 40, such as an energy consumption management circuit unit 420, a display unit 430, an input unit 440, a communication module 450 and a storage unit 460 are respectively identical to functions of the energy consumption management circuit unit 120, the display unit 130, the input unit 140, the communication module 150 and the storage unit 160 in the energy consumption management device 10, which are not repeated hereinafter.

The electronic devices 20(1) to 20(N) are respectively connected to the power meters 60(1) to 60(N) via the wired connections DL(1) to DL(N) (e.g., power lines or other forms of wired connections). The power meters 60(1) to 60(N) are, for example, the general traditional power meters, which only passively detect electricity statuses of the electronic devices 20(1) to 20(N). The power meters 60(1) to 60(N) are not provided with the function of determining the energy consumption operation statuses of the electronic devices 20(1) to 20(N) nor the function of sending the control command.

Accordingly, in this another embodiment, the energy consumption management device 40 can handle the energy consumption operation statuses of the electronic devices 50(1) to 50(N) through the electricity detection data received from the power meters 60(1) to 60(N) to be further compared with the preset operation schedules, so as to control the electronic device 50(1) to 50(N) via the network connection CL.

It should be noted that, the energy consumption feature calculation circuit unit 121, the activity model management circuit unit 122 and the power management circuit unit 123 in the energy consumption management circuit unit 120 described above are implemented in form of hardware circuits, but the disclosure is not limited thereto. For example, in an embodiment, aforementioned circuit units may be implemented in a software or firmware manner as a plurality of program code modules, for example, including: an energy consumption feature calculation module with the function of the energy consumption feature calculation circuit unit 121; an activity model management module with the function of the activity model management circuit unit 122; and a power management module with the function of the power management circuit unit 123. The program code modules may be stored in the storage unit 160, read and loaded into a memory by the processor 124 (or a processors of the server 30 or 70) so the processor 124 (or the processor of the server 30 or 70) can execute the program code modules to realize the energy consumption management method provided by the disclosure.

In summary, under the circumstance where the electronic devices does not actively send its operation information (e.g., the energy consumption operation status), the energy consumption management system and the energy consumption management method provided by the disclosure can determine the energy consumption operation status in which the electronic device is currently operating by receiving the current electricity status of the electronic device, so as to execute subsequent management operations corresponding to the energy consumption operation status. In addition, the energy consumption management system and the energy consumption management method provided by the disclosure can learn the activity model corresponding to the electronic device according to the electricity detection history data of the electronic device, such that the energy consumption management system may estimate the current energy consumption operation status in which the electronic device is operating currently.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

It will be apparent to those skilled in the art that various modifications and variations can be made to the disclosed embodiments. It is intended that the specification and examples be considered as exemplary only, with a true scope of the disclosure being indicated by the following claims and their equivalents.

The invention claimed is:

1. An energy consumption management system for detecting and controlling an energy consumption operation status of an electronic device, comprising:

an energy consumption management device, coupled to the electronic device, wherein the energy consumption management device is configured to detect a first electricity status of the electronic device at a current time point to generate first electricity detection data of the electronic device, wherein the energy consumption management device is further configured to calculate a first energy consumption parameter set having a plurality of first energy consumption parameters according to the first electricity detection data, wherein the energy consumption management device is further configured to determine a plurality of first feature values respectively corresponding to a plurality of feature rules according to the plurality of first energy consumption parameters and the plurality of feature rules, wherein the plurality of first feature values correspond to the first electricity detection data, and the plurality of first feature values form a first feature set corresponding to the current time point, wherein the energy consumption management device is further configured to determine a current energy consumption operation status of the electronic device according to the plurality of first feature values and an activity model corresponding to the electronic device, wherein the activity model is a decision tree, and the decision tree has a plurality of layers, a first layer among the plurality of layers only has one start node, and the start node is configured to indicate a $1^{st}$ feature value of the first feature set, wherein all nodes of the plurality of layers comprise the start node, a plurality of relay nodes and a plurality of end nodes, wherein each of the start node and the plurality of relay nodes is connected to two different sub-nodes according to two feature values of each of the start node and the plurality of relay nodes, wherein the plurality of end nodes corresponds to a plurality of history energy consumption operation statuses, wherein the energy consumption management device or a server connected via a network connection is further configured to control the electronic device according to the current energy consumption operation status of the electronic device and a preset operation schedule.

2. The energy consumption management system according to claim 1, wherein the energy consumption management device is further configured to generate the activity model corresponding to the electronic device by executing a rule creation operation, and the rule creation operation comprises:

reading a plurality of electricity detection history data corresponding to the electronic device by the energy consumption management device, wherein the plurality of electricity detection history data respectively correspond to a plurality of different time points, wherein each of the plurality of electricity detection history data comprises second electricity detection data and a history energy consumption operation status corresponding to one time point among the plurality of time points, wherein the energy consumption management device calculates a plurality of second energy consumption parameter sets corresponding to the plurality of electricity detection history data according to the plurality of second electricity detection data of the plurality of electricity detection history data, wherein each of the second energy consumption parameter sets has a plurality of second energy consumption parameters;

determining a plurality of second feature sets respectively corresponding to the plurality of second energy consumption parameter sets by the energy consumption management device according to the plurality of second energy consumption parameter sets and the plurality of feature rules, wherein each of the second feature sets has a plurality of second feature values respectively corresponding to the plurality of feature rules; and creating the activity model by the energy consumption management device according to the plurality of second feature sets and the plurality of history energy consumption operation statuses of the electronic device respectively corresponding to the plurality of time points.

3. The energy consumption management system according to claim 2, wherein in the operation of creating the activity model by the energy consumption management device according to the plurality of second feature sets and the plurality of history energy consumption operation statuses of the electronic device respectively corresponding to the plurality of time points, the energy consumption management device inputs the plurality of second feature sets and the plurality of history energy consumption operation statuses to a learning model to generate the decision tree.

4. The energy consumption management system according to claim 1, wherein the activity model is the decision tree layered according to the plurality of feature rules, and a bottom layer of the decision tree is a plurality of estimated energy consumption operation statuses, wherein in the operation where the energy consumption management device is further configured to determine the current energy consumption operation status of the electronic device according to the plurality of first feature values and the activity model corresponding to the electronic device, the energy consumption management device determines that the current energy consumption operation status is one of the plurality of estimated energy consumption operation statuses according to the decision tree and a Boolean value of each of the plurality of first feature values respectively corresponding to the plurality of feature rules.

5. The energy consumption management system according to claim 1, wherein the preset operation schedule comprises a plurality of preset energy consumption operation statuses corresponding to a plurality of preset time points, wherein in the operation where the energy consumption management device or the server connected via the network connection is further configured to control the electronic device according to the current energy consumption operation status of the electronic device and the preset operation schedule, the energy consumption management device or the server finds a standard energy consumption operation status corresponding to the current time point in the plurality of preset energy consumption operation statuses of the preset operation schedule according to the preset operation schedule and the current time point, and if the current energy consumption operation status is not identical to the standard energy consumption operation status, the energy consumption management device or the server sends a control command corresponding to the standard energy consumption operation status to the electronic device according to the standard energy consumption operation status so that the electronic device operates in the standard energy consumption operation status.

6. The energy consumption management system according to claim 5, wherein the preset operation schedule further comprises a plurality of preset electricity data corresponding to the plurality of preset energy consumption operation statuses, wherein in the operation where the energy consumption management device or the server connected via the network connection is further configured to control the electronic device according to the current energy consumption operation status of the electronic device and the preset operation schedule, the energy consumption management device or the server identifies standard electricity data corresponding to the standard energy consumption operation status from the plurality of preset electricity data, wherein if the current energy consumption operation status is identical to the standard energy consumption operation status, the energy consumption management device or the server determines whether the current energy consumption operation status is abnormal by comparing the standard electricity data with the first electricity detection data.

7. An energy consumption management method, comprising:

detecting a first electricity status of an electronic device at a current time point to generate first electricity detection data of the electronic device;

calculating a first energy consumption parameter set having a plurality of first energy consumption parameters according to the first electricity detection data;

determining a plurality of first feature values respectively corresponding to a plurality of feature rules according to the plurality of first energy consumption parameters and the plurality of feature rules, wherein the plurality of first feature values correspond to the first electricity detection data, and the plurality of first feature values form a first feature set corresponding to the current time point;

determining a current energy consumption operation status of the electronic device according to the plurality of first feature values and an activity model corresponding to the electronic device; and controlling the electronic device according to the current energy consumption operation status of the electronic device and a preset operation schedule, wherein the activity model is a decision tree, and the decision tree has a plurality of layers, a first layer among the plurality of layers only has one start node, and the start node is configured to indicate a $1^{st}$ feature value of the first feature set, wherein all nodes of the plurality of layers comprise the start node, a plurality of relay nodes and a plurality of end nodes, wherein each of the start node and the plurality of relay nodes is connected to two different sub-nodes according to two feature values of each of the start node and the plurality of relay nodes, wherein the plurality of end nodes corresponds to a plurality of history energy consumption operation statuses.

8. The energy consumption management method according to claim 7, wherein the activity model corresponding to the electronic device is generated by executing a rule creation operation, and the rule creation operation comprises:

reading a plurality of electricity detection history data corresponding to the electronic device, wherein the plurality of electricity detection history data respectively correspond to a plurality of different time points, wherein each of the plurality of electricity detection history data comprises second electricity detection data and a history energy consumption operation status corresponding to one time point among the plurality of time points;

calculating a plurality of second energy consumption parameter sets corresponding to the plurality of electricity detection history data according to the plurality of second electricity detection data of the plurality of electricity detection history data, wherein each of the second energy consumption parameter sets has a plurality of second energy consumption parameters;

determining a plurality of second feature sets respectively corresponding to the plurality of second energy consumption parameter sets according to the plurality of second energy consumption parameter sets and the plurality of feature rules, wherein each of the second feature sets has a plurality of second feature values respectively corresponding to the plurality of feature rules; and creating the activity model according to the plurality of second feature sets and the plurality of history energy consumption operation statuses of the electronic device respectively corresponding to the plurality of time points.

9. The energy consumption management method according to claim 8, wherein the step of creating the activity model according to the plurality of second feature sets and the plurality of history energy consumption operation statuses of the electronic device respectively corresponding to the plurality of time points comprises:

inputting the plurality of second feature sets and the plurality of history energy consumption operation statuses to a learning model, so as to generate the decision tree.

10. The energy consumption management method according to claim 7, wherein the activity model is the decision tree layered according to the plurality of feature rules, and a bottom layer of the decision tree is a plurality of estimated energy consumption operation statuses, wherein the step of determining the current energy consumption operation status of the electronic device according to the plurality of first feature values and the activity model corresponding to the electronic device comprises:

determining that the current energy consumption operation status is one of the plurality of estimated energy consumption operation statuses according to the decision tree and a Boolean value of each of the plurality of first feature values respectively corresponding to the plurality of feature rules.

11. The energy consumption management method according to claim 7, wherein the preset operation schedule comprises a plurality of preset energy consumption operation statuses corresponding to a plurality of preset time points, wherein the step of controlling the electronic device according to the current energy consumption operation status of the electronic device and the preset operation schedule comprises:

finding a standard energy consumption operation status corresponding to the current time point in the plurality of preset energy consumption operation statuses of the preset operation schedule according to the preset operation schedule and the current time point; and if the current energy consumption operation status is not identical to the standard energy consumption operation status, sending a control command corresponding to the standard energy consumption operation status to the electronic device according to the standard energy consumption operation status so that the electronic device operates in the standard energy consumption operation status.

12. The energy consumption management method according to claim 7, wherein the preset operation schedule further comprises a plurality of preset electricity data corresponding to the plurality of preset energy consumption operation statuses, wherein the step of controlling the electronic device according to the current energy consumption operation status of the electronic device and the preset operation schedule further comprises:

identifying standard electricity data corresponding to the standard energy consumption operation status from the plurality of preset electricity data; and if the current energy consumption operation status is identical to the standard energy consumption operation status, determining whether the current energy consumption operation status is abnormal by comparing the standard electricity data with the first electricity detection data.

13. An energy consumption management system for detecting and controlling an energy consumption operation status of an electronic device, comprising:

a power measurement unit, coupled to the electronic device; and an energy consumption management device, connected to the power measurement unit via a network connection, wherein the power measurement unit is configured to detect a first electricity status of the electronic device at a current time point, so as to generate first electricity detection data of the electronic device, wherein the first electricity detection data is transmitted to the energy consumption management device via the network connection, wherein the energy consumption management device is configured to calculate a first energy consumption parameter set having a plurality of first energy consumption parameters according to the first electricity detection data, wherein the energy consumption management device is further configured to determine a plurality of first feature values respectively corresponding to a plurality of feature rules according to the plurality of first energy consumption parameters and the plurality of feature rules, wherein the plurality of first feature values correspond to the first electricity detection data, and the plurality of first feature values form a first feature set corresponding to the current time point, wherein the energy consumption management device is further configured to determine a current energy consumption operation status of the electronic device according to the plurality of first feature values and an activity model corresponding to the electronic device, wherein the activity model is a decision tree, and the decision tree has a plurality of layers, a first layer among the plurality of layers only has one start node, and the start node is configured to indicate a $1^{st}$ feature value of the first feature set, wherein all nodes of the plurality of layers comprise the start node, a plurality of relay nodes and a plurality of end nodes, wherein each of the start node and the plurality of relay nodes is connected to two different sub-nodes according to two feature values of each of the start node and the plurality of relay nodes, wherein the plurality of end nodes corresponds to a plurality of history energy consumption operation statuses, wherein the energy consumption management device or a server connected via another network connection is configured to control the electronic device according to the current energy consumption operation status of the electronic device and a preset operation schedule.

\* \* \* \* \*